United States Patent
Kim et al.

(10) Patent No.: US 8,237,165 B2
(45) Date of Patent: Aug. 7, 2012

(54) ORGANIC LIGHT EMITTING DIODE DISPLAY AND METHOD OF MANUFACTURING THE SAME

(75) Inventors: Tae-Woong Kim, Yongin (KR); Dong-un Jin, Yongin (KR); Dong-Bum Lee, Yongin (KR); Denis Stryakhilev, Yongin (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 101 days.

(21) Appl. No.: 12/794,242

(22) Filed: Jun. 4, 2010

(65) Prior Publication Data
US 2010/0308335 A1 Dec. 9, 2010

(30) Foreign Application Priority Data

Jun. 4, 2009 (KR) .................. 10-2009-0049642

(51) Int. Cl.
*H01L 51/52* (2006.01)
*H01L 51/56* (2006.01)
(52) U.S. Cl. .............. 257/59; 257/E51.018; 438/28
(58) Field of Classification Search .......... 257/40, 257/59, 72, E51.018, E27.111, E21.5; 438/28
See application file for complete search history.

(56) References Cited

U.S. PATENT DOCUMENTS

| | | | |
|---|---|---|---|
| 2003/0034497 A1 | 2/2003 | Yamazaki et al. | |
| 2003/0062519 A1 | 4/2003 | Yamazaki et al. | |
| 2003/0184704 A1 | 10/2003 | Akiyama et al. | |
| 2005/0078099 A1 | 4/2005 | Amundson et al. | |
| 2008/0157067 A1* | 7/2008 | Shiba et al. | 257/40 |

FOREIGN PATENT DOCUMENTS

| | | |
|---|---|---|
| JP | 2003-115388 A | 4/2003 |
| JP | 2003-280035 A | 10/2003 |
| JP | 2005-251671 A | 9/2005 |
| JP | 2006-171454 A | 6/2006 |
| JP | 2008-153004 A | 7/2008 |
| JP | 2008-256736 A | 10/2008 |

(Continued)

OTHER PUBLICATIONS

Lifka, et al., Ultra-Thin Flexible OLED Device; SID 07 Digest; 2007; pp. 1599-1602; Phillips Research Eindhoven, High Tech Campus 4, 5656 AE Eindhoven, The Netherlands.

(Continued)

*Primary Examiner* — Benjamin Sandvik
*Assistant Examiner* — Whitney T Moore
(74) *Attorney, Agent, or Firm* — Lee & Morse, P.C.

(57) ABSTRACT

An organic light emitting diode (OLED) display and a method of manufacturing the same, the OLED display including a flexible substrate, a driving circuit unit on the flexible substrate, the driving circuit unit including a thin film transistor (TFT), an organic light emission element on the flexible substrate, the organic light emission element being connected to the driving circuit unit, an encapsulating thin film on the flexible substrate, the encapsulating thin film covering the organic light emission element and the driving circuit unit, a first protection film facing the encapsulating thin film, a second protection film facing the flexible substrate, a first sealant disposed between the encapsulating thin film and the first protection film, and a second sealant disposed between the flexible substrate and the second protection film.

20 Claims, 7 Drawing Sheets

FOREIGN PATENT DOCUMENTS

| | | |
|---|---|---|
| JP | 2008-277047 A | 11/2008 |
| KR | 10 2006-0000188 A | 1/2006 |
| KR | 10 2007-00774 A | 7/2007 |
| KR | 10 2008-00115 A | 2/2008 |
| KR | 10 2008-0073252 A | 8/2008 |
| KR | 10 2008-0073941 A | 8/2008 |
| KR | 10 2009-0033861 A | 4/2009 |

OTHER PUBLICATIONS

Gleskova, et al.; Amorphous Silicon Thin-Film Transistors on Compliant Polyimide Foil Substrates; IEEE Electron Device Letters; Sep. 1999; pp. 473-475; vol. 20 Issue 9; IEEE.

Grego, et al., Development and evaluation of bend-testing techniques for flexible-display applications; Journal of the SID; 2005; pp. 575-581; 13/7; Society for Information Display; United States.

* cited by examiner

ORGANIC LIGHT EMITTING DIODE DISPLAY AND METHOD OF MANUFACTURING THE SAME

BACKGROUND

1. Field

Embodiments relate to an organic light emitting diode (OLED) display and a method of manufacturing the same.

2. Description of the Related Art

An OLED display is a self-emissive display that may include, e.g., a hole injection electrode, an electron injection electrode, and an organic light emission layer between the hole injection electrode and the electron injection electrode. The OLED display may emit light as holes injected from the hole injection electrode, e.g., anode, and electrons injected from the electron injection electrode, e.g., cathode, which are recombined to return to a ground state in the organic light emission layer.

OLED displays may have desirable properties, e.g., low power consumption, high luminance, a high reaction speed, and the like. Thus, OLED displays are receiving much attention as a next-generation display device for mobile electronic devices.

However, if the OLED display uses a heavy and easily broken glass substrate, there may be limits in its portability and implementation of a large-scale screen display.

A flexible OLED display, which may be, e.g., lightweight and resistant to impact, is being developed by using a flexible substrate, e.g., plastic. Because such a flexible OLED display may be, e.g., folded or rolled, its portability may be maximized and utilized for various fields.

The above information disclosed in this Background section is only for enhancement of understanding of the background of the described technology and therefore it may contain information that does not form the prior art that is already known in this country to a person of ordinary skill in the art.

SUMMARY

Embodiments are directed to an organic light emitting diode (OLED) display and a method of manufacturing the same, which represent advances over the related art.

It is a feature of an embodiment to provide an organic light emitting diode (OLED) display having improved durability with respect to a repeated bending operation and a maximized bending degree thereof.

At least one of the above and other features and advantages may be realized by providing an organic light emitting diode (OLED) display including a flexible substrate; a driving circuit unit on the flexible substrate, the driving circuit unit including a thin film transistor (TFT); an organic light emission element on the flexible substrate, the organic light emission element being connected to the driving circuit unit; an encapsulating thin film on the flexible substrate, the encapsulating thin film covering the organic light emission element and the driving circuit unit; a first protection film facing the encapsulating thin film; a second protection film facing the flexible substrate; a first sealant disposed between the encapsulating thin film and the first protection film; and a second sealant disposed between the flexible substrate and the second protection film.

A thickness from an outer surface of the first protection film to the driving circuit unit may be equal to a thickness from an outer side of the second protection film to the driving circuit unit.

A sum thickness of the encapsulating thin film, the first sealant, and the first protection film may be equal to a sum thickness of the flexible substrate, the second sealant, and the second protection film.

When a bending moment is applied, the TFT of the driving circuit unit may be positioned at a neutral plane between the first protection film and the second protection film.

The first protection film and the second protection film may exhibit the same physical properties, and the first sealant and the second sealant may exhibit the same physical properties.

The first protection film and the second protection film may each have a thickness of about 10 μm to about 100 μm.

The first sealant and the second sealant may each have a thickness of about 1 μm to about 30 μm.

The display may be bendable to a curvature radius of about 5 mm without damaging the TFT of the driving circuit unit.

The display may be bendable to a curvature radius of about 3 mm without damaging the TFT of the driving circuit unit.

The flexible substrate may be made of a plastic material.

At least one of the above and other features and advantages may also be realized by providing a method for manufacturing an organic light emitting diode (OLED) display, the method including forming a flexible substrate on a glass substrate; forming a driving circuit unit on the flexible substrate such that the driving circuit unit includes a thin film transistor (TFT); forming an organic light emission element on the flexible substrate such that the organic light emission element is connected to the driving circuit unit; forming an encapsulating thin film on the flexible substrate such that the encapsulating thin film covers the organic light emission element and the driving circuit unit; coupling a first protection film on the encapsulating thin film with a first sealant; separating the glass substrate from the flexible substrate; and coupling a second protection film on the flexible substrate with a second sealant.

A thickness from an outer surface of the first protection film to the driving circuit unit may be equal to a thickness from an outer side of the second protection film to the driving circuit unit.

A sum thickness of the encapsulating thin film, the first sealant, and the first protection film may be equal to a sum thickness of the flexible substrate, the second sealant, and the second protection film.

When a bending moment is applied, the TFT of the driving circuit unit may be positioned at a neutral plane between the first and second protection films.

The first protection film and the second protection film may have the same physical properties, and the first sealant and the second sealant may have the same physical properties.

The first protection film and the second protection film may each have a thickness of about 10 μm to about 100 μm.

The first sealants and the second sealant may each have a thickness of about 1 μm to about 30 μm.

At least one of the first protection film and the second protection film may be a polarizer.

The OLED display may be capable of being bent to a curvature radius of about 5 mm without damaging the TFT of the driving circuit unit.

The OLED display may be capable of being bent to a curvature radius of about 3 mm without damaging the TFT of the driving circuit unit.

The flexible substrate may be made of a plastic material.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
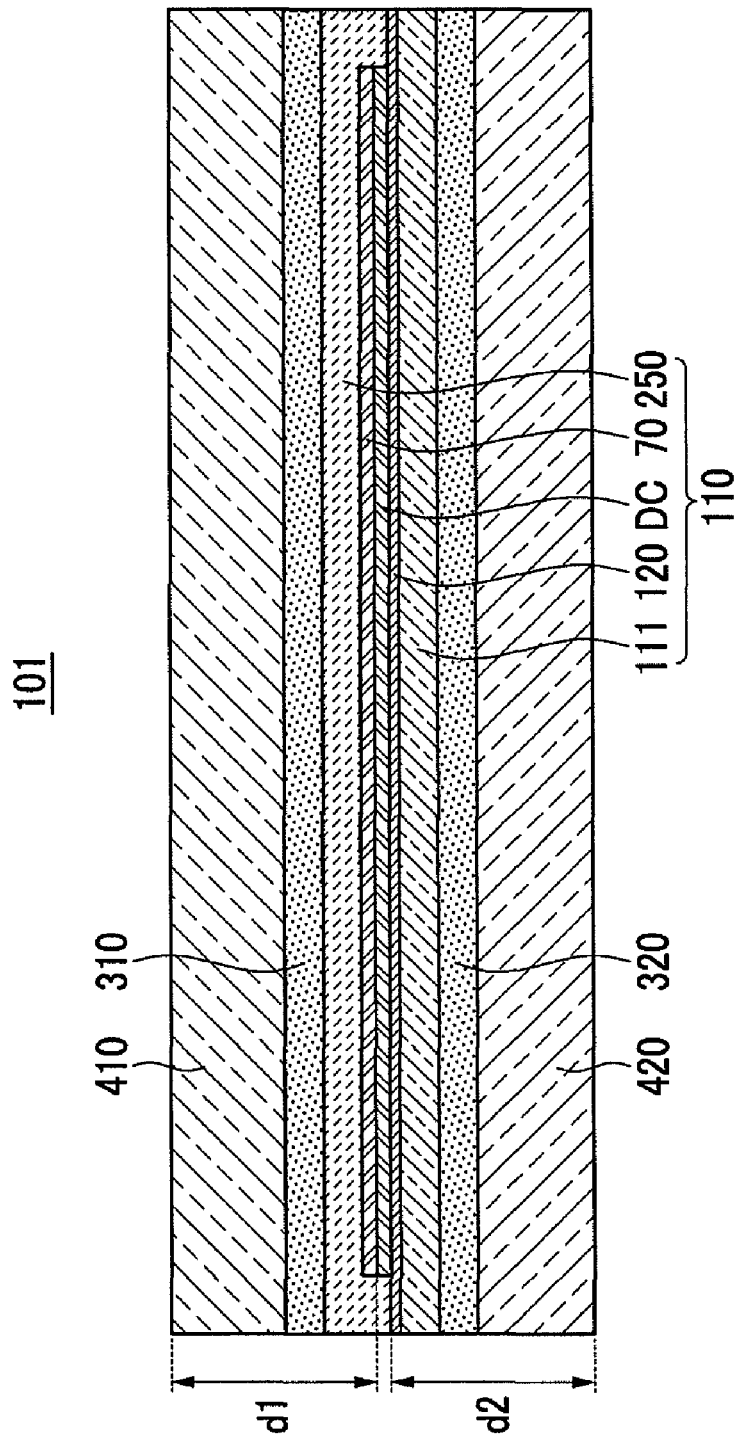
FIG. 1 illustrates a cross-sectional view of an organic light emitting diode (OLED) display according to an embodiment.

Korean Patent Application No. 10-2009-0049642, filed on Jun. 4, 2009, in the Korean Intellectual Property Office, and entitled: "Organic Light Emitting Diode Display and Method for Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

In order to clarify the embodiments, parts that are not connected with the description may be omitted.

An organic light emitting diode (OLED) display according to an embodiment will now be described with reference to FIGS. 1 and 2.

As illustrated in FIG. 1, the OLED display 101 according to an embodiment may include, e.g., a display panel 110, a first protection film 410, a first sealant 310, a second protection film 420, and a second sealant 320.

The display panel 110 may include, e.g., a flexible substrate 111, a driving circuit (DC) unit, an organic light emission element 70 (e.g., an organic light emitting diode (OLED)), and an encapsulating thin film 250.

The flexible substrate 111 may be made of, e.g., a flexible plastic material. The flexible plastic material may include, e.g., polyethylene terephthalate, polyethylene naphthalate, polycarbonate, polyarylate, polyetherimide, polyethersulfone, polyimide, and the like. However, the embodiments are not meant to be limited thereto, and the flexible substrate 111 may be made of a flexible metallic material, e.g., stainless steel. In addition, various other flexible materials may be used to form the flexible substrate 111.

The DC unit may include, e.g., thin film transistors (TFTs) 10 and 20 (See FIG. 5), and may drive the organic light emission element 70. The organic light emission element 70 connected to the DC unit may emit light according to a drive signal transferred from the DC unit, thus displaying an image.

Figure 5:
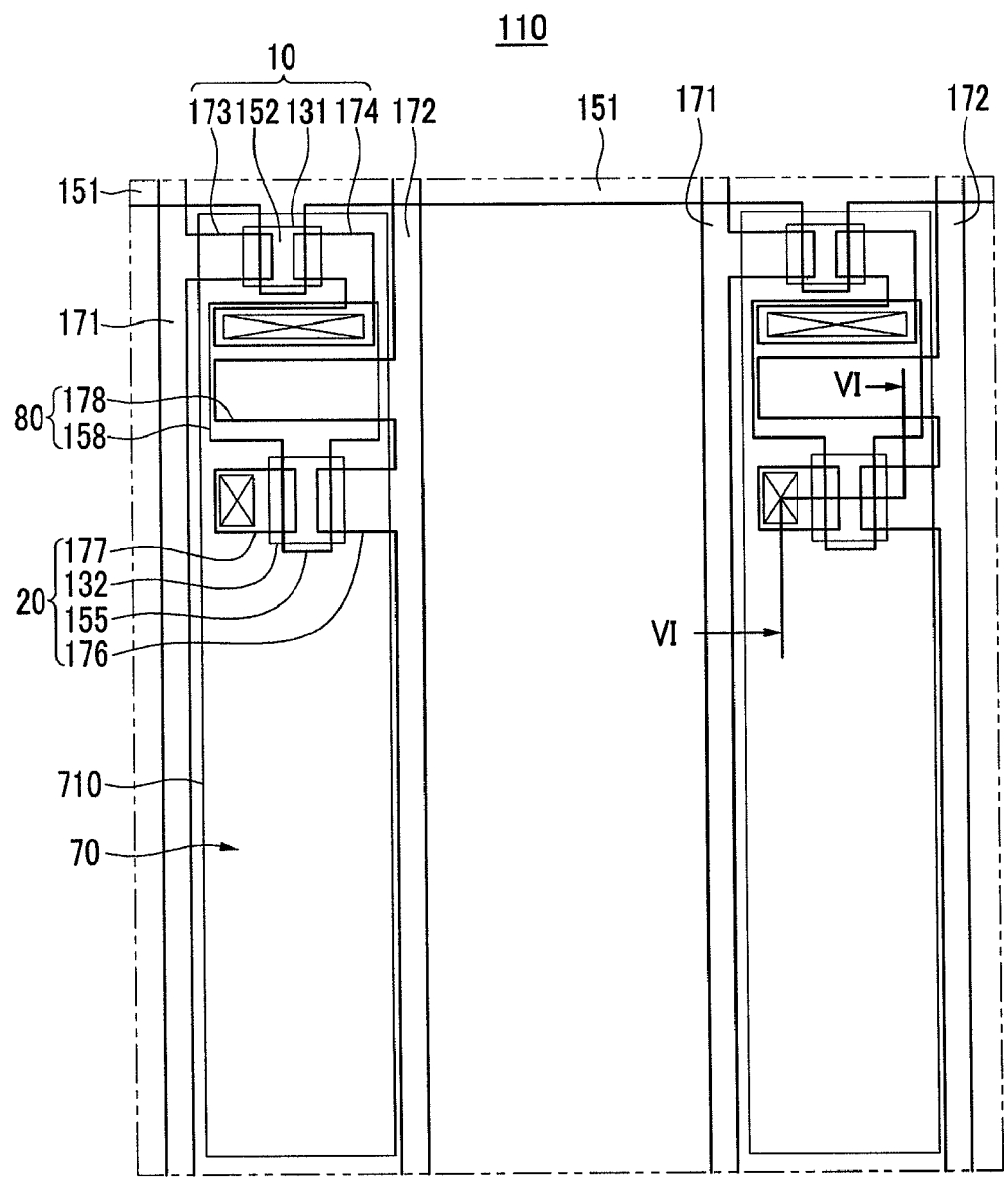
FIG. 5 illustrates an enlarged layout view of an internal structure of a display panel of the OLED display of FIG. 1.
Figure 6:
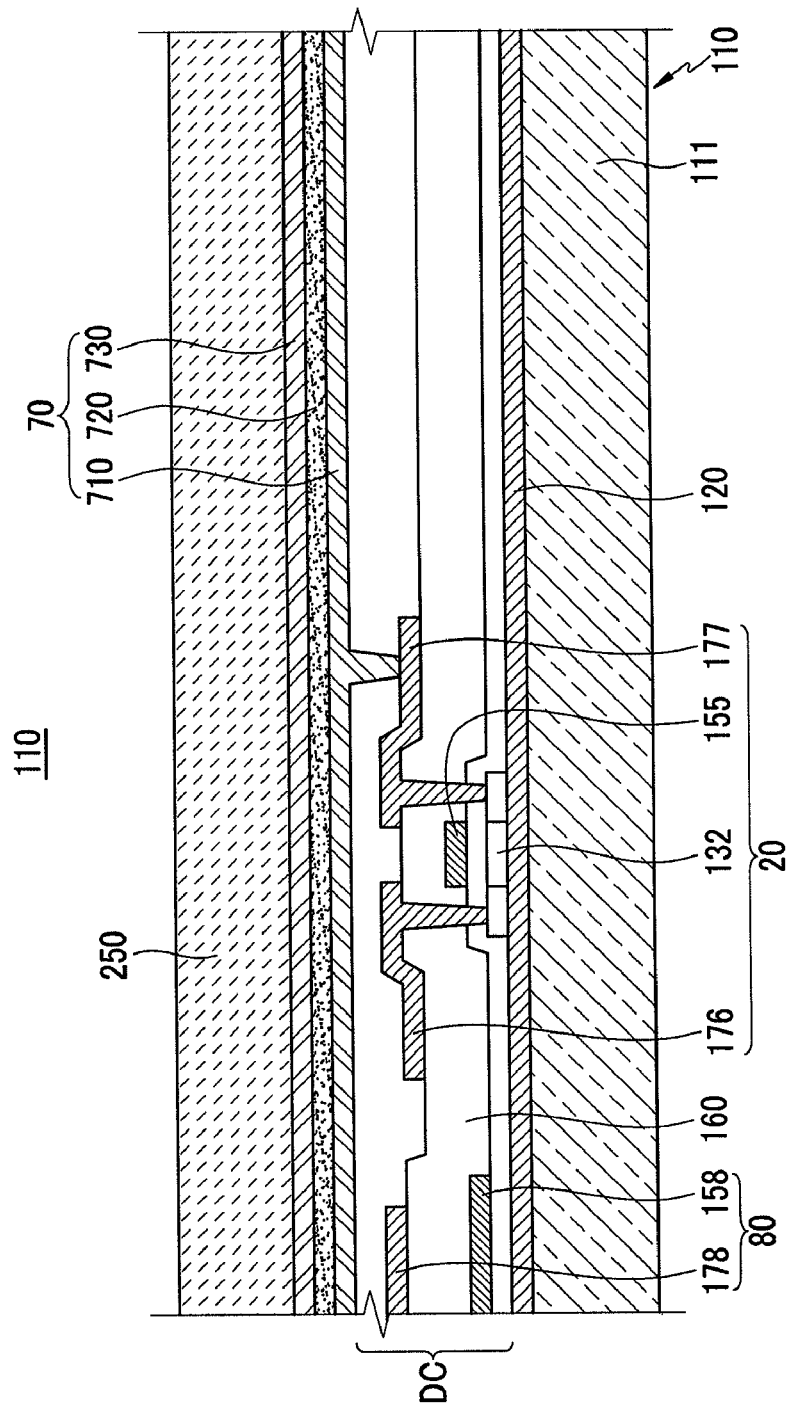
FIG. 6 illustrates a cross-sectional view taken along line VI-VI of FIG. 5.

A detailed structure of the organic light emission element 70 and the DC unit is illustrated in FIGS. 5 and 6, but the embodiments are not limited thereto. The organic light emission element 70 and the DC unit may be formed with various other structures, which a skilled person in the art can easily modify.

Although not illustrated, the encapsulating thin film 250 may have a multi-layered structure. The encapsulating thin film 250 may be formed of, e.g., a plurality of inorganic films or a mixture of inorganic films and organic films. In an implementation, the encapsulating thin film 250 may be formed by using various types of inorganic films and organic films known to persons skilled in the art. The encapsulating film 250 may prevent an unnecessary and/or undesirable component, e.g., moisture or the like, from penetrating into the organic light emission element 70. In this regard, if moisture were to penetrate into the organic light emission element 70, the lifespan of the organic light emission element 70 may be reduced.

The display panel 110 may further include, e.g., a barrier film 120 disposed between the flexible substrate 111 and the DC unit. The barrier film 120 may include, e.g., one or more of various inorganic films and organic films. The barrier film 120 may also prevent an unnecessary and/or undesirable component, e.g., moisture or the like, from penetrating the flexible substrate 111 into the organic light emission element 70. Again, if moisture were to penetrate into the organic light emission element 70, the lifespan of the organic light emission element 70 may be reduced.

In an implementation, in order to prevent infiltration of moisture into the organic light emission element 70, the encapsulating thin film 250 and the barrier film 120 may have a water vapor transmission rate (WVTR) of about $10^{-6}$ g/m²/day or less.

The first protection film 410 may face the encapsulating thin film 250. The first sealant 310 may be disposed between the first protection film 410 and the encapsulating thin film 250. That is, the first protection film 410 may be attached to the encapsulating thin film 250 by means of the first sealant 310. In an implementation, the first sealant 310 may have adhesive properties.

The second protection film 420 may face the flexible substrate 111. The second sealant 320 may be disposed between the second protection film 420 and the flexible substrate 111. That is, the second protection film 420 may be attached to the flexible substrate 111 by means of the second sealant 320. In an implementation, the second sealant 320 may have adhesive properties.

The first and second protection films 410 and 420 may have the same physical properties, and may improve, e.g., mechanical strength of the display panel 110. The first and second protection films 410 and 420 may be made of, e.g., a plastic material, and, like the flexible substrate 111, the first and second protection films 410 and 420 may have flexible characteristics. In an implementation, various types of films known to the skilled person in the art may be used as the first and second protection films 410 and 420.

At least one of the first and second films 410 and 420 may have a polarization function. In other words, at least one of the first and second films 410 and 420 may be a polarizer. Here, disposition of the polarizing protection films may be determined according to a direction in which the organic light emission element 70 emits light. In particular, if the organic light emission element 70 performs top emission, that is, if the organic light emission element 70 emits light toward the first protection film 410 to display an image, the first protection film 410 may be a polarizer. If the organic light emission element 70 performs bottom emission, that is, if the organic light emission element 70 emits light toward the second protection film 420 to display an image, the second protection film 420 may be a polarizer. If the organic light emission element 70 performs double-side emission, the first and second protection films 410 and 420 may both be polarizers.

If only one of the first and second protection films 410 and 420 is a polarizer, the other may be made of substantially the same material, in terms of physical properties, except that it may not perform the polarization function. Here, having the same physical properties refers to having very similar physical properties, although they may not necessarily be the same materials.

In an implementation, neither the first nor the second protection films 410 and 420 may be polarizers.

The first and second sealants 310 and 320 may have the same physical properties. The first and second sealants 310 and 320 may both have, e.g., relatively smooth, soft, and pliable qualities compared with the first and second protection films 410 and 420, the flexible substrate 111, and the encapsulating thin film 250. In an implementation, various types of sealants known to a person skilled in the art may be used as the first and second sealants 310 and 320.

Also, as illustrated in FIG. 1, a thickness d1 from an outer surface of the first protection film 410 to the DC unit and a thickness d2 from an outer surface of the second protection film 420 to the DC unit may be equal. In particular, when the first and second sealants 310 and 320 are formed from the same material and have the same thickness, thicknesses of the first and second protection films 410 and 420 may be determined in consideration of thicknesses of elements of the display panel 110, e.g., the encapsulating thin film 250, the flexible substrate 111, and the like.

The display panel 110, excluding the flexible substrate 111, may have a thickness of, e.g., only a few micrometers and may unintentionally be easily bent or folded. The flexible substrate 111 may have a thickness of, e.g., only scores of micrometers, and may not be able to physically protect the organic light emission element 70 and the DC unit by itself.

Thus, a device including only the display panel 110 may have inferior portability thereof and may be easily damaged. Hence, the first and second protection films 410 and 420 may be attached to, e.g., improve mechanical strength and prevent the display panel 110 from being damaged.

Inclusion of only one of the first and second protection films 410 and 420 may improve the mechanical strength of a device including the display panel 110. However, with only one of the first and second protection films 410 and 420 attached to the display panel 110, if bending is repeated, tensile stress or compressive stress generated during the bending may be transferred to the display panel 110. That is, when a bending moment is applied, a neutral plane (NP) (See FIG. 2) may be formed at an inner side of the first protection film 410 or the second protection film 420, each having a relatively large thickness compared with the display panel 110. The NP is a plane that is simply bent with its original length maintained, without being stretched or contracted, when the bending moment is applied. The NP generated when the bending moment is applied to an object may be formed in the middle of the object. Thus, significant tensile stress or compressive stress may be applied to the display panel 110 disposed at an edge of the first protection film 410 or the second protection film 420. In this case, the stress applied to the display panel 110 may become stronger further away from the NP. If the stress is repeatedly applied to the display panel 110, or if stress greater than a breaking strength is applied to the display panel 110, elements, e.g., the TFTs 10 and 20 (See FIG. 5) within the display panel 110 may be damaged and/or conductive wiring may be disconnected.

Thus, in an embodiment, thicknesses of the first and second protection films 410 and 420 may be determined such that the thickness d1 (See FIG. 1) from the outer surface of the first protection film 410 to the DC unit and the thickness d2 (See FIG. 1) from the outer side of the second protection film 420 to the DC unit may be equal.

Figure 2:
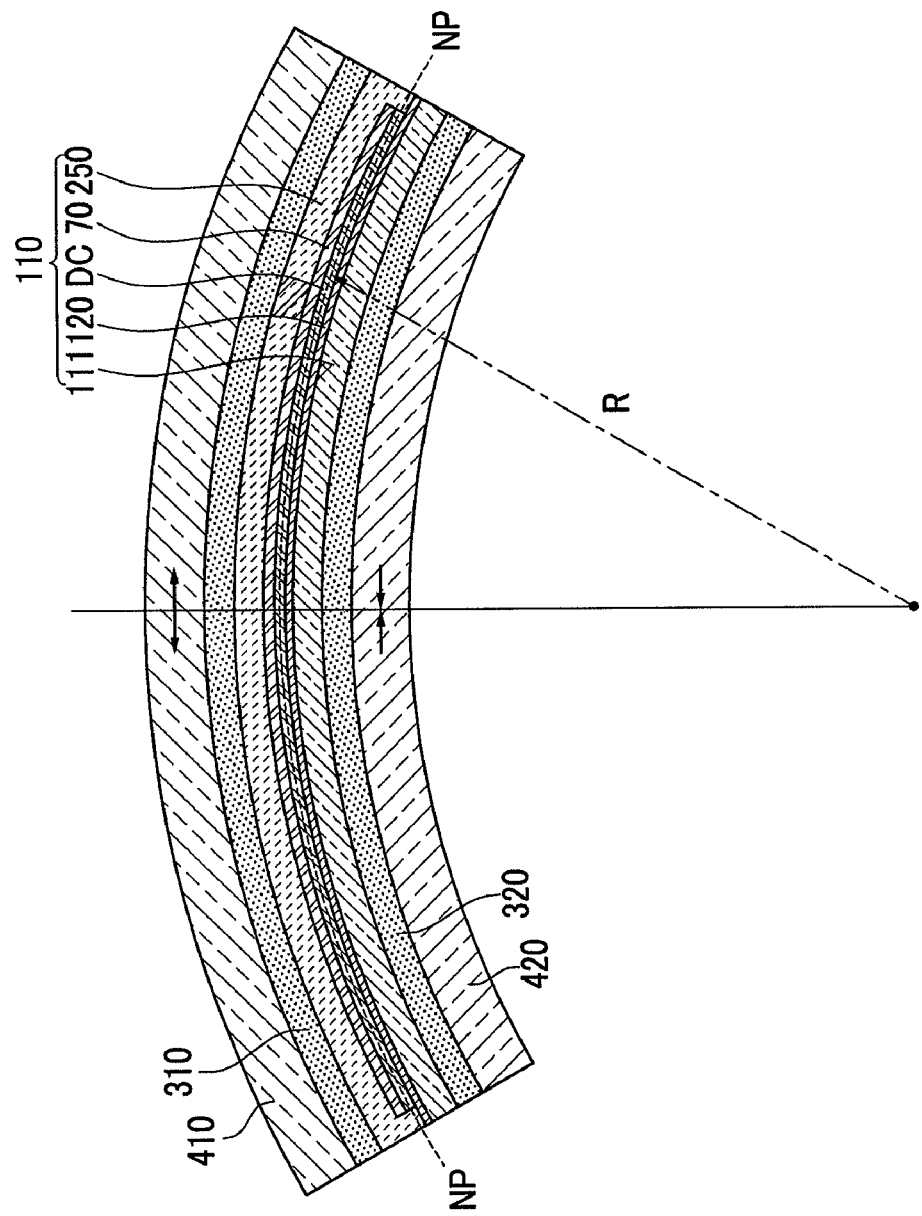
FIG. 2 illustrates a cross-sectional view of a bent state of the OLED display of FIG. 1.

With such a configuration, the NP formed between the first and second protection films 410 and 420 when the bending moment is applied, as illustrated in FIG. 2, may be positioned along sensitive components, e.g., the TFT 20 (See FIG. 6), of the DC unit. In this case, it is preferred that the first and second protection films 410 and 420 have the same physical properties, in order to position the NP along the sensitive components, e.g., the TFT 20, of the DC unit. In other words, a distance from the sensitive components of the DC unit to an outer surface of the first protection film 410 may be equal to a distance from the sensitive components of the DC unit to an outer surface of the second protection film 420.

Accordingly, even if the OLED display 101 is repeatedly bent, there may be little stress applied to the sensitive components of the DC unit, e.g., the TFT 20, thus preventing the sensitive components, e.g., the TFT 20, from being damaged.

The NP generated when the bending moment is applied to an object may be formed in the middle of the object. Thus, when the first and second protection films 410 and 420 have the same physical properties and the same thicknesses d1 and d2, with the DC unit interposed therebetween, the NP generated when the bending moment is applied to the OLED display 101 may extend along the DC unit.

Meanwhile, a position of the TFTs 10 and 20 (See FIG. 5) within the DC unit, a thickness of the organic light emission element 70, a thickness of a pixel defining film 190 (See FIG. 6), and a thickness of the barrier film 120 may be variably modified by the skilled person in the art. Accordingly, the position of the TFTs 10 and 20 may differ according to types of the OLED display 101. Thus, if levels of tensile stress and compressive stress generated when the bending moment is applied are as small as possible due to, e.g., the thicknesses of the protection films 410 and 420, the stresses may not damage the sensitive components, e.g., TFTs 10 and 20. In addition, if a sum thickness of the encapsulating thin film 250, the first sealant 310, and the first protection film 410 and a sum thickness of the flexible substrate 111, the second sealant 320, and the second protection film 420 are equal, the NP generated when the bending moment is applied to the OLED display 101 may substantially extend along the DC unit including, e.g., the TFT 20.

In addition, even if the first and second protection films 410 and 420 have thicknesses d1 and d2 that are not exactly equal, i.e., even if their thicknesses are slightly different, the simple presence of both the first and second protection films 410 and 420 may allow sensitive components, e.g., the TFT 20 (See FIG. 6), to be positioned near the NP, significantly reducing damage to the sensitive components, e.g., the TFT 20.

In this manner, by having the NP generated when the bending moment is applied to the OLED display 101 extend along the DC unit, the sensitive components of the DC unit, e.g., the TFT 20, may be essentially free from applied stress, and may not be damaged.

In addition, the OLED display 101 of an embodiment may be bent to a substantial degree. In particular, the OLED display 101 may be stably bent to a curvature radius (R) down to about 3 mm. Maintaining the curvature radius (R) of the bent OLED display 101 at greater than about 3 may help ensure that the sensitive components, e.g., the TFTs 10 and 20 (See FIG. 5), of the DC unit are not damaged.

In FIG. 2, the arrows indicated as solid lines represent the tensile stress and the compressive stress generated when the bending moment is applied. The tensile stress and/or the compressive stress may be stronger farther away from the NP.

The first and second protection films 410 and 420 may each have a thickness of about 10 μm to about 100 μm. Maintaining the thickness of the first and second protection films 410 and 420 at about 10 μm or greater may help ensure that the first and second protection films 410 and 420 are able to stably protect the display panel 110. Maintaining the thickness of the first and second protection films 410 and 420 at about 100 μm or less may help ensure that an overall thickness of the OLED display 101 is not unnecessarily large. In addition, maintaining the thickness of the first and second protection films 410 and 420 at about 100 μm or less may help ensure that flexibility of the OLED display 101 does not deteriorate.

In addition to the role of coupling the first and second protection films 410 and 420 to the encapsulating thin film 250 and the flexible substrate 111, respectively, the first and second sealants 310 and 320 may also reduce stress generated when the OLED display 101 is bent. Because the first and second sealants 310 and 320 may have relatively smooth, soft, and pliable qualities, when the OLED display 101 is bent, a sliding phenomenon, e.g., at an interface between respective sealants and protection films, may occur to some extent. Thus, the first and second sealants 310 and 320 may reduce the tensile stress and the compressive stress generated when the bending moment is applied, by a sliding amount due to the presence of the first and second sealants 310 and 320.

The first and second sealants 310 and 320 may each have a thickness of about 1 μm to about 30 μm. Maintaining the thickness of the first and second sealants 310 and 320 at about 1 μm or greater may help ensure that the first and second sealants 310 and 320 are able to stably couple the first and second protection films 410 and 420 to the flexible substrate 111 and the encapsulating thin film 250, respectively, and properly reduce the stress generated when the OLED display 101 is bent. Maintaining the thickness of the first and second sealants 310 and 320 at about 30 μm or less may help ensure that the thickness of the first and second sealants 310 and 320 is not unnecessarily large. In addition, maintaining the thickness of the first and second sealants 310 and 320 at about 30 μm or less may help ensure that an excessive sliding phenomenon does not occur due to excessive thickness of the first and second sealants 310 and 320, thus stably coupling the first and second protection films 410 and 420 to the flexible substrate 111 and the encapsulating thin film 250, respectively.

With such a configuration, the OLED display 101 of an embodiment may have improved durability with respect to almost unlimited repeated bending operations, and its bending degree may be maximized.

A method of manufacturing the OLED display 101 of FIG. 1 will now be described with reference to FIGS. 3 and 4.

Figure 3:
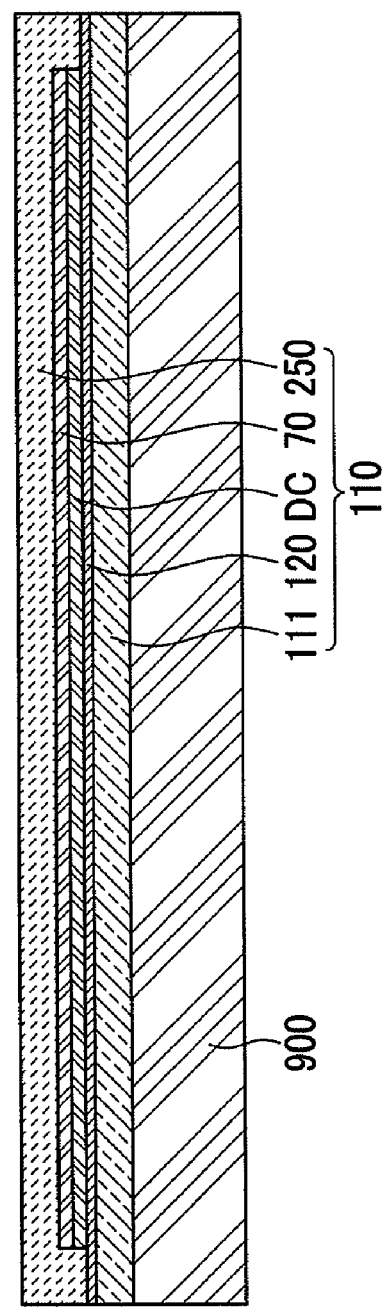
FIGS. 3 and 4 illustrate cross-sectional views of stages in a method of manufacturing the OLED display of FIG. 1.

First, as illustrated in FIG. 3, the flexible substrate 111 may be formed on a glass substrate 900. The flexible substrate 111 may be made of a plastic material having good heat resistance and durability, e.g., polyethylene terephthalate, polyethylene naphthalate, polycarbonate, polyarylate, polyetherimide, polyethersulfone, polyimide, and the like.

The flexible substrate 111 may, e.g., bend and/or expand when heat is applied thereto. Thus, it may be difficult to precisely form thin film patterns, e.g., various electrodes or conductive wiring, thereon. Accordingly, the flexible substrate 111 may be attached to the glass substrate 900 while conducting various thin film pattern formation processes.

Next, the barrier film 120 may be formed on the flexible substrate 111. The DC unit and the organic light emission element 70 may then be formed on the barrier film 120. Then, the encapsulating thin film 250 may be formed to cover the organic light emission element 70 and the DC unit on the flexible substrate 111, thus completing the display panel 110.

Figure 4:
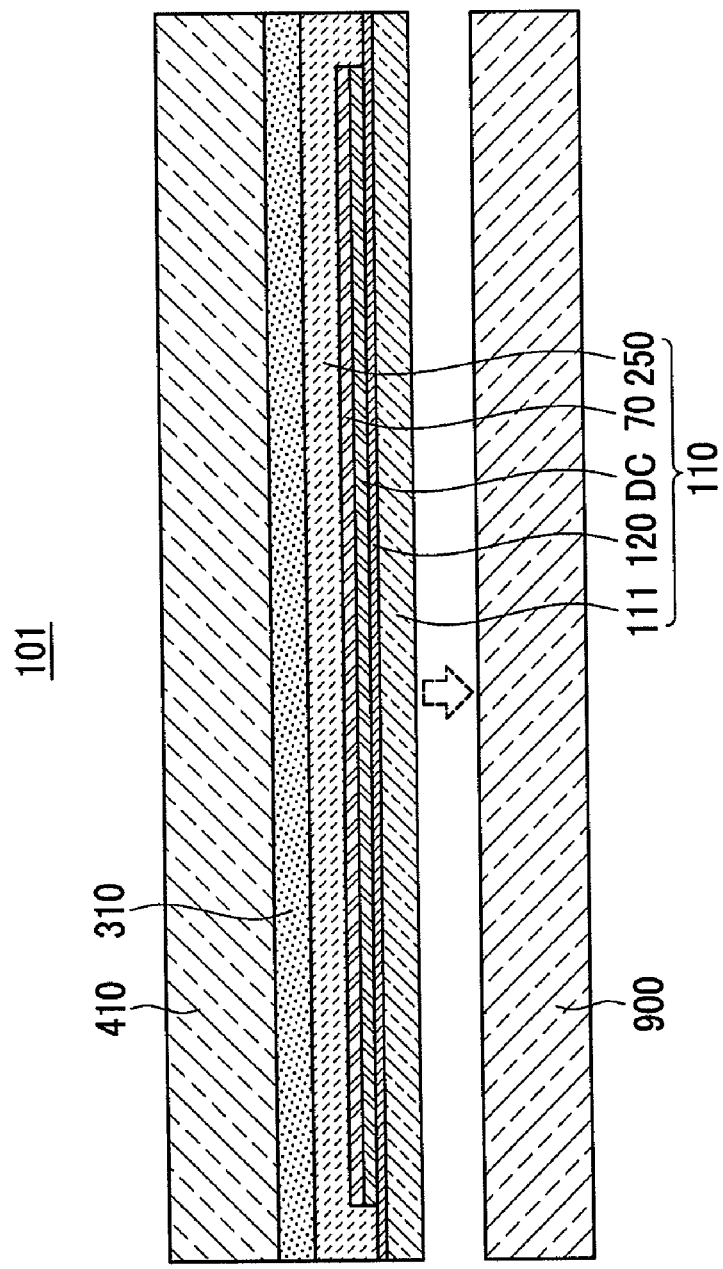

Then, as illustrated in FIG. 4, the first protection film 410 may be attached to the encapsulating thin film 250 by using the first sealant 310. Next, the glass substrate 900 may be detached from the flexible substrate 111.

Subsequently, the second protection film 420 may be attached to the flexible substrate 111 where the glass substrate 900 was detached, by using the second sealant 320.

Through such a manufacturing method, the OLED display 101 may have improved durability with respect to almost unlimited repeated bending operations, and its bending degree may be maximized.

FIG. 5 illustrates an enlarged layout view of a pixel structure of the display panel 110. FIG. 6 illustrates a cross-sectional view taken along line VI-VI of the display panel 110 in FIG. 5.

As illustrated in FIGS. 5 and 6, the display panel 110 may include a switching TFT 10, a driving TFT 20, a storage capacitor 80, and the organic light emission element 70 (e.g., an organic light emitting diode (OLED)) at each pixel. Here, the structure including the switching TFT 10, the driving TFT 20, and the storage capacitor 80 may constitute the DC unit. The display panel 110 may further include a gate line 151 disposed along one direction, a data line 171 insulated from and crossing the gate line 151, and a common power line 172. Here, a single pixel may be defined by borders of the gate line 151, the data line 171, and the common power line 172, but it may not necessarily be limited thereto. A pixel refers to a minimum unit for displaying an image, and the display panel 110 may display an image through a plurality of pixels.

FIG. 5 illustrates an active matrix (AM) type of OLED display 101 with a 2Tr-1Cap structure including two TFTs and one storage capacitor in a single pixel, but the embodiments are not limited thereto. That is, the OLED display 101 may include three or more TFTs and two or more storage capacitors in a single pixel, or may have various other structures by further including other wiring.

The organic light emission element 70 may include, e.g., a pixel electrode 710, an organic light emission layer 720 formed on the pixel electrode 710, and a common electrode 730 formed on the organic light emission layer 720. Here, the pixel electrode 710 may be a positive (+) electrode, i.e. a hole injection electrode, and the common electrode 730 may be a negative (−) electrode, i.e. an electron injection electrode. However, the embodiments are not necessarily limited thereto, and the pixel electrode 710 may be a negative electrode and/or the common electrode may be a positive electrode, according to a driving method of the OLED display 101. Holes and electrons from the pixel electrode 710 and the common electrode 730 may be injected into the organic light emission layer 720. When excitons, formed as the injected holes and electrons are combined, return to a base state from an excited state, light is emitted.

In the OLED display 101 of an embodiment, the organic light emission element 70 may emit light toward the encapsulating thin film 250. In other words, the organic light emission element 70 may be a top emission type of element. Here, in order for the organic light emission element 70 to emit light toward the encapsulating thin film 250, a reflective electrode may be used as the pixel electrode 710 and a transmissive or transflective electrode may be used as the common electrode 730. However, the OLED display 101 of an embodiment is not limited to the top emission type of device. That is, the OLED display 101 may be, e.g., a bottom emission type of device or a double-sided emission type of device.

The storage capacitor 80 may include a pair of storage plates 158 and 178 with an interlayer insulating layer 160 interposed therebetween. Here, the interlayer insulating layer 160 may be a dielectric material. Capacitance may be determined by charges charged in the storage capacitor 80 and voltage between the two storage plates 158 and 178.

The switching TFT 10 may include, e.g., a switching semiconductor layer 131, a switching gate electrode 152, a switching source electrode 173, and a switching drain electrode 174. The driving TFT 20 may include, e.g., a driving semiconductor layer 132, a driving gate electrode 155, a driving source electrode 176, and a driving drain electrode 177.

FIG. 6 illustrates a TFT 20 with a top gate structure, but the embodiments are not limited thereto. That is, a TFT with a bottom gate structure may be employed. In an implementation, at least one of the switching semiconductor layer 131 and the driving semiconductor layer 132 may be, e.g., an oxide semiconductor layer.

The switching TFT 10 may be used as a switching element for selecting a pixel intended for light emission. The switching gate electrode 152 may be connected to the gate line 151. The switching source electrode 173 may be connected to the data line 171. The switching drain electrode 174 may be separated from the switching source electrode 173 and connected to the storage plate 158.

The driving TFT 20 may apply driving power to the pixel electrode 710 for emitting light in the organic light emission layer 720 of the organic light emission element 70 within a selected pixel. The driving gate electrode 155 may be connected to the storage plate 158 that is connected to the switching drain electrode 174. The driving source electrode 176 and the other storage plate 178 may be respectively connected to the common power line 172. The driving drain electrode 177 may be connected to the pixel electrode 710 of the organic light emission element 70 via a contact hole.

With such a configuration, the switching TFT 10 may operate by a gate voltage applied to the gate line 151 to transfer a data voltage applied to the data line 171 to the driving TFT 20. A voltage corresponding to a difference between the common voltage applied from the common power line 172 to the driving TFT 20 and the data voltage transferred to the switching TFT 10 may be stored in the storage capacitor 80. As current corresponding to the voltage stored in the storage capacitor 80 flows to the organic light emission element 70 via the driving TFT 20, the organic light emission element 70 may emit light.

As illustrated in FIG. 6, the encapsulating thin film 250 may be disposed on the organic light emission element 70 in order to, e.g., protect the organic light emission element 70 and the DC unit.

The barrier film 120 may be formed directly on the flexible substrate 111. The barrier film 120 may include, e.g., one or more films among various inorganic films and organic films. The barrier film 120 may prevent an unnecessary and/or undesirable component, e.g., moisture, from penetrating the flexible substrate 111 into the organic light emission element 70.

An experimental example according to an embodiment and a comparative example will now be described with reference to FIGS. 2 and 7. In the experimental example, the first and second protection films 410 and 420 having the same physical properties and the same thicknesses were attached to the encapsulating thin film 250 and the flexible substrate 111 of the display panel 110 according to an embodiment. In the comparative example, only the first protection film 410 was attached to the encapsulating thin film 250 of the display panel 110.

The display devices of the experimental example and the comparative example, were respectively bent according to the method as illustrated in FIG. 2, to gradually reduce their respective curvature radii (R).

Figure 7:
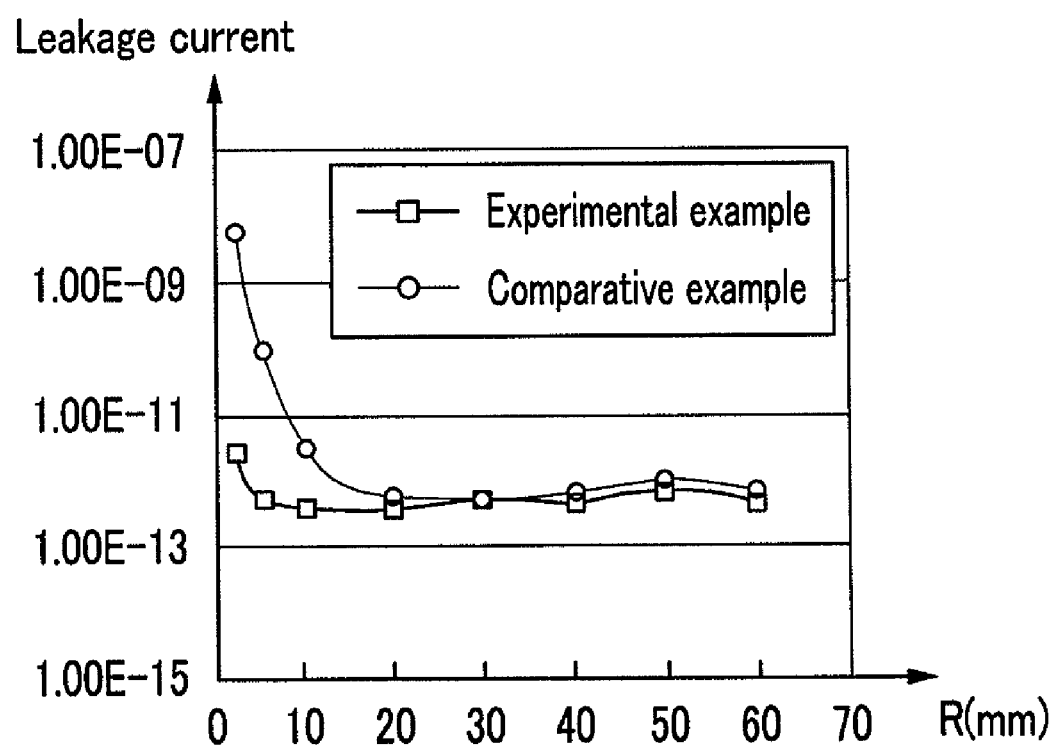
FIG. 7 illustrates a graph of experimentation results comparatively showing an experimental example according to an embodiment and a comparative example.

As illustrated in FIG. 7, it is noted that a TFT of the comparative example was damaged when the curvature radius reached 10 mm, generating a leakage current greater than a reference value. Meanwhile, it is noted that, when the curvature radius of the device according to the experimental example reached 5 mm, the TFT was not damaged. When the curvature radius reached 3 mm, the TFT was damaged. That is, it may be noted that the experimental example exhibited a superior capacity of being stably bent compared with the comparative example.

Further, additional experimentation was conducted on the device according to the experimental example, in which the device according to the experimental example was bent to a curvature radius of 5 mm and flattened repeatedly, i.e., 10,000 times. It was observed that the TFT was not damaged even after the 10,000 repeated bending and flattening operations.

Through such experimentation, it may be seen that the OLED display 101 according to an embodiment exhibited improved durability with respect to repeated bending operations, and its bending degree was maximized.

Accordingly, due to its flexibility and structure, if the flexible OLED display of an embodiment is excessively or repeatedly bent, a sensitive component, e.g., a thin film transistor (TFT), may not be damaged and/or conductive wiring may not be disconnected.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode (OLED) display, comprising:
    a flexible substrate;
    a driving circuit unit on the flexible substrate, the driving circuit unit including a thin film transistor (TFT);
    an organic light emission element on the flexible substrate, the organic light emission element being connected to the driving circuit unit;
    an encapsulating thin film on the flexible substrate, the encapsulating thin film covering the organic light emission element and the driving circuit unit;
    a first protection film facing the encapsulating thin film;
    a second protection film facing the flexible substrate;
    a first sealant disposed between the encapsulating thin film and the first protection film; and
    a second sealant disposed between the flexible substrate and the second protection film;
    wherein:
        when a bending moment is applied, the TFT of the driving circuit unit is positioned at a neutral plane between the first protection film and the second protection film, and
        the first protection film and the second protection film each have a thickness of about 10 μm to about 100 μm.

2. The organic light emitting diode (OLED) display as claimed in claim 1, wherein a thickness from an outer surface of the first protection film to the driving circuit unit is equal to a thickness from an outer side of the second protection film to the driving circuit unit.

3. The organic light emitting diode display as claimed in claim 1, wherein a sum thickness of the encapsulating thin film, the first sealant, and the first protection film is equal to a sum thickness of the flexible substrate, the second sealant, and the second protection film.

4. The organic light emitting diode display as claimed in claim 1, wherein:
the first protection film and the second protection film exhibit the same physical properties, and
the first sealant and the second sealant exhibit the same physical properties.

5. The organic light emitting diode display as claimed in claim 4, wherein the first sealant and the second sealant each have a thickness of about 1 μm to about 30 μm.

6. The organic light emitting diode display as claimed in claim 4, wherein at least one of the first protection film and the second protection film is a polarizer.

7. The organic light emitting diode display as claimed in claim 1, wherein the display is bendable to a curvature radius of about 5 mm without damaging the TFT of the driving circuit unit.

8. The organic light emitting diode display as claimed in claim 7, wherein the display is bendable to a curvature radius of about 3 mm without damaging the TFT of the driving circuit unit.

9. The organic light emitting diode display as claimed in claim 7, wherein the flexible substrate is made of a plastic material.

10. A method for manufacturing an organic light emitting diode (OLED) display, the method comprising:
forming a flexible substrate on a glass substrate;
forming a driving circuit unit on the flexible substrate such that the driving circuit unit includes a thin film transistor (TFT);
forming an organic light emission element on the flexible substrate such that the organic light emission element is connected to the driving circuit unit;
forming an encapsulating thin film on the flexible substrate such that the encapsulating thin film covers the organic light emission element and the driving circuit unit;
coupling a first protection film on the encapsulating thin film with a first sealant;
separating the glass substrate from the flexible substrate; and
coupling a second protection film on the flexible substrate with a second sealant;
wherein:
when a bending moment is applied, the TFT of the driving circuit unit is positioned at a neutral plane between the first protection film and the second protection film, and
the first protection film and the second protection film each have a thickness of about 10 μm to about 100 μm.

11. The method for manufacturing an organic light emitting diode display as claimed in claim 10, wherein a thickness from an outer surface of the first protection film to the driving circuit unit is equal to a thickness from an outer side of the second protection film to the driving circuit unit.

12. The method for manufacturing an organic light emitting diode display as claimed in claim 10, wherein a sum thickness of the encapsulating thin film, the first sealant, and the first protection film is equal to a sum thickness of the flexible substrate, the second sealant, and the second protection film.

13. The method for manufacturing an organic light emitting diode display as claimed in claim 10, wherein:
the first protection film and the second protection film have the same physical properties, and
the first sealant and the second sealant have the same physical properties.

14. The method for manufacturing an organic light emitting diode display as claimed in claim 13, wherein the first sealants and the second sealant each have a thickness of about 1 μm to about 30 μm.

15. The method for manufacturing an organic light emitting diode display as claimed in claim 13, wherein at least one of the first protection film and the second protection film is a polarizer.

16. The method for manufacturing an organic light emitting diode display as claimed in claim 10, wherein the OLED display is capable of being bent to a curvature radius of about 5 mm without damaging the TFT of the driving circuit unit.

17. The method for manufacturing an organic light emitting diode display as claimed in claim 10, wherein the OLED display is capable of being bent to a curvature radius of about 3 mm without damaging the TFT of the driving circuit unit.

18. The method for manufacturing an organic light emitting diode display as claimed in claim 17, wherein the flexible substrate is made of a plastic material.

19. An organic light emitting diode (OLED) display, comprising:
a flexible substrate;
a driving circuit unit on the flexible substrate, the driving circuit unit including a thin film transistor (TFT);
an organic light emission element on the flexible substrate, the organic light emission element being connected to the driving circuit unit;
an encapsulating thin film on the flexible substrate, the encapsulating thin film covering the organic light emission element and the driving circuit unit;
a first protection film facing a side of the encapsulating thin film that is opposite a side of the encapsulating thin film that faces the driving circuit unit; and
a second protection film facing a side of the flexible substrate that is opposite a side of the flexible substrate that faces the driving circuit unit;
wherein a thickness from an outer surface of the first protection film to the driving circuit unit is equal to a thickness from an outer side of the second protection film to the driving circuit unit.

20. The organic light emitting diode display as claimed in claim 19, wherein the first protection film and the second protection film each have a thickness of about 10 μm to about 100 μm.

\* \* \* \* \*